United States Patent [19]

Bethea et al.

[11] Patent Number: 4,739,385
[45] Date of Patent: Apr. 19, 1988

[54] MODULATION-DOPED PHOTODETECTOR

[75] Inventors: Clyde G. Bethea, Plainfield; Chung Y. Chen, Scotch Plains; Alfred Y. Cho, Summit, all of N.J.

[73] Assignee: American Telephone and Telegraph Company, AT&T Bell Laboratories, Murray Hill, N.J.

[21] Appl. No.: 5,357

[22] Filed: Jan. 12, 1987

Related U.S. Application Data

[63] Continuation of Ser. No. 435,702, Oct. 21, 1982, abandoned.

[51] Int. Cl.$^4$ .............. H01L 29/80; H01L 31/10; H01L 29/40; H01L 29/14
[52] U.S. Cl. .................... 357/30; 357/16; 357/22
[58] Field of Search ............. 357/30 E, 30 I, 30 M, 357/16, 22 A

[56] References Cited

U.S. PATENT DOCUMENTS

| | | | |
|---|---|---|---|
| 4,075,651 | 2/1978 | James | 357/16 |
| 4,424,525 | 1/1984 | Mimura | 357/23 NS |
| 4,450,462 | 5/1984 | Nuyen | 357/16 |
| 4,455,564 | 6/1984 | Delagebeaudeuf et al. | 357/16 |

OTHER PUBLICATIONS

Pan, *Proceed. of the SPIE*, vol. 150, Laser & Fiber Optics Comm., 1978, San Diego, Ca., 28, 29, Aug. 1978, pp. 175–184.

Arai et al., *Jap. Jour. of App. Phys.*, vol. 19, 1980, Suppl. 19-1, pp. 411–414.

T. Sugeta et al., "High Speed Photoresponse Mechanism of a GaAs-MESFET," *Japanese Journal of Applied Physics*, vol. 19, No. 1, Jan. 1980, pp. L27-L29.

J. C. Gammel et al., "The OPFET: A New High Speed Optical Detector," *International Electron Devices Meeting*, Washington, D.C., Dec. 4–6, 1978, pp. 120–123.

C. Baack et al., "GaAs MESFET: A High-Speed Optical Detector," *Electronics Letters*, vol. 13, No. 7, Mar. 31, 1977, p. 193.

*Primary Examiner*—Andrew J. James
*Assistant Examiner*—Jerome Jackson, Jr.
*Attorney, Agent, or Firm*—Richard D. Laumann; Peter A. Businger

[57] ABSTRACT

A modulation-doped field effect photodetector has a fast response time.

7 Claims, 1 Drawing Sheet

MODULATION-DOPED PHOTODETECTOR

This application is a continuation of application Ser. No. 435,702, filed Oct. 21, 1982, now abandoned.

TECHNICAL FIELD

This invention relates generally to photodetectors and particularly to photodetectors having modulation-doped heterostructures.

BACKGROUND OF THE INVENTION

There has been interest in recent years in photodetectors that have response times of approximately several tens of picoseconds or less. This interest in high speed photodetectors has been stimulated by several developments. For example, communications systems using glass fibers, commonly termed "optical fibers", to optically couple light sources and photodetectors have developed to the point where gigabit data rates are presently contemplated. The photodetectors used in such system need to have picosecond response times. High speed photodetectors are also increasingly desired and necessary for the accurate measurement and characterization of, for example, fast opto-electronic processes such as the dynamic response of semiconductor lasers.

As might be expected, several approaches have been taken in attempts to develop high speed photodetectors. One such approach uses GaAs metal-semiconductor field effect transistors, commonly referred to MESFETs, as high speed photodetectors. Such MESFETs were initially developed for discrete microwave devices and for high speed logic circuits. The high speed optical response of a GaAs MESFET was reported by Baack et al in *Electronics Letters*, 13, p. 193, 1977. Additional high speed GaAs MESFET devices were reported in *Japanese Journal of Applied Physics*, 19, pp. 27–L29, January 1980, and by Gammel et al in *IEDM Technical Digest*, p. 120, 1978. Devices using this approach are attractive candidates for high speed photodetectors because of their rapid response time and the possibility they afford of achieving optical gain.

However, the MESFET photodetectors reported in the literature generally suffer drawbacks that limit their usefulness as detectors in optical communications systems. For example, they typically have a thin active layer, approximately 0.2 μm, and consequently, the incident radiation may be absorbed primarily in the semi-insulating substrate which is often filled with traps. Furthermore, the photodetectors generally have a small gate-drain spacing, typically approximately 2 μm, which results in poor optical coupling efficiency between the incident radiation from, for example, an optical fiber, and the photodetector or requires precise alignment of optical beam and the detector.

SUMMARY OF THE INVENTION

We have found that a modulation-doped heterostructure MESFET is a fast photodetector even when it has a relatively large gate-drain spacing. The photodetector comprises a first semiconductor layer comprising a first semiconductor having a low bandgap, a second semiconductor layer comprising a second semiconductor having a first conductivity type and a high bandgap, and source and drain electrodes on said second layer. There is band bending and as a result a two-dimensional electron gas (2DEG) exists close to the interface of the first and second layers. The device may further comprise a gate electrode on said second layer. In a first preferred embodiment, the first conductivity type is n-type because of the higher electron mobility. In another preferred embodiment, the photodetectors comprise Group III-V compound semiconductors such as $Al_xGa_{1-x}As$ or $In_xGa_{1-x}As$. These photodetectors may also comprise a spacer layer between the first and second semiconductor layers.

DETAILED DESCRIPTION

Figure 1:
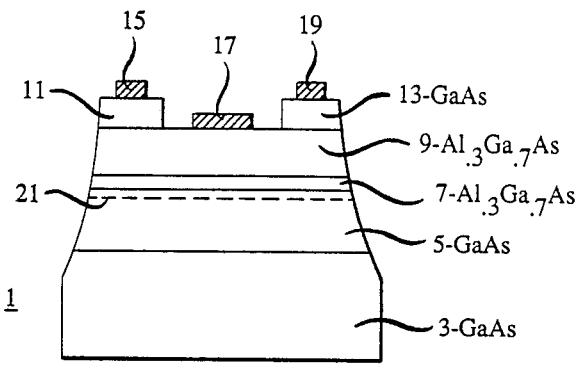
FIG. 1 shows an exemplary embodiment of a photodetector according to this invention in cross section.

Referring now to the FIG. 1, there is shown in cross-sectional view an exemplary embodiment of our invention. For reasons of clarity, the elements of the device are not shown to scale. The device, indicated generally as 1, comprises a substrate 3, a first semiconductor layer 5 comprises a first semiconductor having a low bandgap, a second semiconductor layer 7, a third semiconductor layer 9 comprising a second semiconductor having a high bandgap, and a fourth semiconductor layer indicated as 11 and 13. The device further comprises contact 15 to the third semiconductor layer 9 and contacts 17 and 19 to semiconductor segments 11 and 13, respectively. Contacts 15, 17, adn 19 form source, gate and drain electrodes, respectively. The band bending between semiconductor layers 5 and 9 is such that there exists a 2DEG, indicated as 21, in layer 5 close to the interface between layers 5 and 7. The first and second layers are nominally undoped and the third layer as well as layers 11 and 13 have a first conductivity type and are highly doped. The second layer is relatively thin, that is, it should be less than 150 Angstroms thick and is nominally undoped. It serves as a spacer layer and may be omitted if desired. The gate electrode may be omitted in some embodiments. In a preferred embodiment, the first conductivity type is n-type because of the higher electron mobility. The gate voltage for device operation is typically between 0.0 volts and the pinch-off voltages.

The devices of this invention are conveniently fabricated with Group II-VI and III-V compound semiconductors. These semiconductors permit fabrication of photodetectors having optical sensitivities within the region that extends from the visible to the infrared. For example, $Al_{0.3}Ga_{0.7}As$ permits the photodetector to have high sensitivity at 0.8 μm while $Ga_{0.7}In_{0.53}As$ yields photodetectors having sensitivity between approximately 0.96 μm and 1.65 μm. As will be appreciated by those skilled in the art, sensitivities within the region are desirable for the optical communications presently contemplated.

Devices according to our invention are conveniently fabricated by, for example, growing the semiconductor layers by molecular beam epitaxy. This method is well known to those skilled in the art and need not be described in detail. All layers should be grown lattice matched to the substrate. Conventional lithographic and etching techniques are then employed to define the mesa and layers 11 and 13. The gate contact is, for example, a Schottky barrier. Source and drain ohmic contacts are conveniently made by evaporating metal, for example, Ge/Au/Ni which is then alloyed at a temperature of, for example, approximately 450 degrees C. for a time of, for example, 15 seconds, sufficient to make sure that an ohmic contact is formed. Other metals could, of course, be used. Gate lengths are desirably between 0.5 and 20.0 μm while the gate-drain spacing is desirably between 2.0 and 100.0 μm. Lengths less than 0.5 μm are presently undesirable because of lithographic difficulties while lengths greater than 20.0 μm may lead to smaller optical gain because of the long transit time. Gate-drain spacings less than 2.0 μm may lead to reduced optical coupling efficiency while spacings greater than 100.0 μm may lead to undesirably high RC time constants.

In the embodiment depicted of our device, layer 5 comprised a 1 μm thick layer of undoped GaAs, layer 7 comprised a 75 Angstrom thick layer of undoped $Al_{0.3}Ga_{0.7}As$, layer 9 comprised a 520 Angstrom thick layer of Si doped n-type $Al_{0.3}Ga_{0.7}As$ with a dopant concentration of $2\times 10^{18}/cm^3$, and layers 11 and 13 comprised a 200 Angstrom thick layer of $n^+$-type GaAs having a dopant concentration of $2\times 10^{18}/cm^3$. Layer 5 is normally p-type with a dopant concentration of $10^{14}/cm^3$. The layers may also comprise $In_xGa_{1-x}As_yP_{1-y}$. In another device, the layers comprised $In_xGa_{1-x}As$ grown lattice matched to InP substrates, i.e., the layers had x=0.53 and y=1.0.

The response speed of the photodetector is determined primarily by the strong built-in electric field created by the heterojunction between the first and third semiconductor layers. This permits picosecond photodetection with extremely low, less than 0.5 volts, applied voltage.

The reasons for the fast response time may be better understood by consideration of the following discussion. Although several mechanisms have been hypothesized in the literature to account for the optical gain in MESFETs, we believe that our optical gain is consistent with the mechanism, photoconductivity, first hypothesized by Gammel and Ballantyne. In discussing the detection process, it will be assumed that the first semiconductor layer is relatively thick and absorbing and that a relatively short wavelength incident radiation is used. Accordingly, absorption in the semi-insulating substrate may be neglected because it is small. It will further be assumed that the detectors have a gate length of approximately 20.0 μm and are therefore operating at the low field regime rather than in the saturated velocity regime. The assumption regarding gate length is made only to demonstrate device operation. Smaller gate lengths will, of course, yield better optical gain. It ill further be assumed, as is true for $Al_xGa_{1-x}As$ and $In_xGa_{1-x}As$, that electron mobilities are much larger than the hole mobilities and, therefore, the photocurrent is dominated by electron flow. Accordingly, the optical gain G, which is conventionally defined as being the ratio of the number of carriers collected by external circuits to the number of photons absorbed may be written as:

$$G=(\eta_i \tau_n L_g)/t_n L_{gd}$$

where $\eta_i$ is the internal quantum efficiency, $\tau_n$ is the excess electron lifetime, $t_n$ is the electron transit time across the gate, $L_g$ is the gate length, and $L_{gd}$ is the gate-drain spacing. It should be noted that $t_n$ in this equation is determined by the gate length rather than by the gate-drain spacing. Furthermore, in order for this gain to be completely realized, the incident pulses should be long enough to allow the current flow to reach a steady state.

The photocurrent is almost completely dominated by electrons and the response speed of the photodetector is thus determined primarily by how rapidly the photogenerated electrons are collected. The photoelectrons, which are minority carriers, are generated by photon absorption in the $p^-$-GaAs layer 5 and experience a vertical electric field which is associated with the band bending of the heterojunction and a lateral electric field which is associated with the applied drain voltage. As the electrons traverse the GaAs layer with a large velocity component in the vertical direction, most will reach and be collected by the 2DEG layer. In this layer, the electrons have a high mobility and reach the drain electrode within a dielectric relaxation time. With the Group III-V materials mentioned, this is typically less than 0.1 picoseconds. This situation is analogous to the collection of photogenerated electrons by an n-type semiconductor in a conventional p-n junction photodetector. Thus, the response time of the detectors is determined by the electron transmit time across the undoped GaAs layer in the vertical direction rather than by the 8.0 μm gap. This is important for device design as it means that devices fabricated with large gate-drain spacings will have rapid response times. The experimental results discussed below strongly suggest that the transit time was determined by the built-in vertical electric field rather than by the lateral applied electric field.

The sensitivity of a detector was measured by using a $Al_xGa_{1-x}As$ laser emitting at a wavelength of approximately 0.82 μm which was driven by 50 nsec electrical pulses. This measurement technique avoided difficulties associated with the response speed of the measuring instruments and also permitted the photodetector to reach a steady state. A silicon photodiode was used for sensitivity calibrations. At zero gate bias, the detector showed an Ac sensitivity greater than 4.2 A/W at $V_{DS}$ of approximately 5 volts. This corresponds to an external quantum efficiency of approximately 630 percent. The observed optical gain is attributed to an increase in the number of carriers in the conduction channel.

Figure 2:
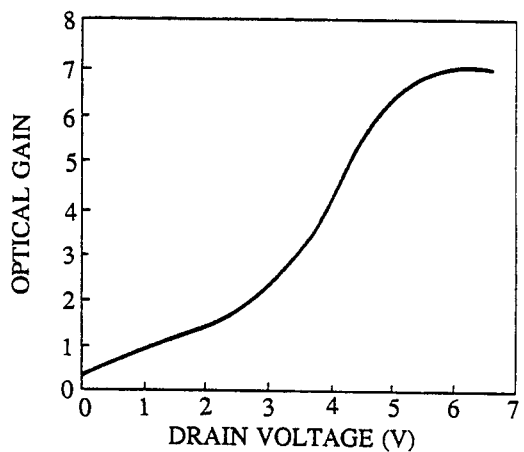
FIG. 2 plots the optical gain vertically versus the drain voltage, in units of volts, horizontally for a device according to our invention.

In general, the sensitivity of our photodetector increases as $V_{DS}$ increases. The optical gain increases gradually with increasing drain-source voltages and ultimately saturates as is shown in FIG. 2 which plots the optical gain vertically versus the drain-source voltage horizontally in volts. The increase in sensitivity is believed due largely to an increase in electron drift velocity. The observed saturation voltage of 5.6 volts across a 20.0 μm gate length is in reasonable experimental agreement with an electric field of $3\times 10^3$ V/cm which is required for k space transfer in GaAs. This suggests that the observed optical gain in our photodetector was not due to a transconductance amplification.

Figure 3:
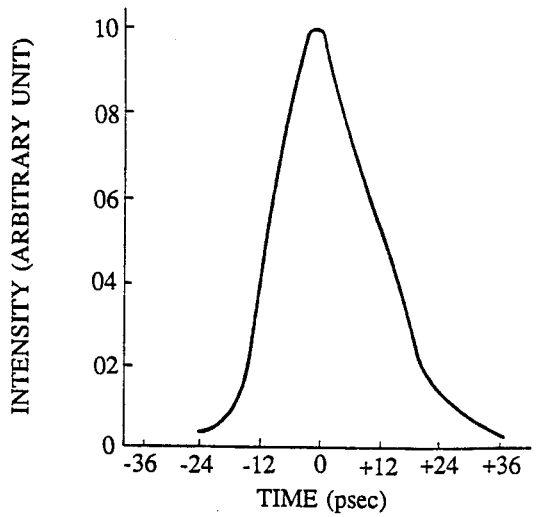
FIG. 3 plots the response speed of a device according to our invention.

The response speed of our photodetector was tested by using a mode-locked dye laser emitting at approximately 0.6 μm and having a pulse duration of 6 picoseconds together with a repetition rate of 80 MHz and an average power of 5 mW. The beam was incident on the photodetector between the gate and drain. A rise time of approximately 30 picoseconds was observed for a device with a gate length of 20.0 μm together with full width at half maximum at approximately 40 picoseconds. The response speed is plotted in FIG. 3 with the time plotted horizontally in units of picoseconds and the intensity plotted vertically in arbitrary units. These values were largely limited by the sampling oscilloscope. A more accurate measurement of the response time was made by performing cross correlation measurements using an optical sampling gate which had two similar detectors. The sampling gate essentially had two transistors connected in series. This connection permits the impulse response to the observed only when both incident optical pulses are synchronized. A rise time of 12 picoseconds and a full width at half maximum of 27 picoseconds was observed.

The source-gate capacitance is not significant in analyzing device performance because photodetection does not require that this capacitance be charged and discharged.

What is claimed is:

1. A photodetector device, said device comprising
a first semiconductor layer which comprises a first semiconductor material having a first bandgap;
a second semiconductor layer which comprises a second semiconductor material having a second bandgap and a first conductivity type, and said second bandgap being greater than said first bandgap, whereby a two-dimensional electron gas is formed in said first layer;
said device comprising source, gate, and drain electrodes on said second semiconductor layer; and
the spacing between said gate and drain electrodes being in the range from 8 $\mu$m to 100 $\mu$m.

2. The device of claim 1 in which said gate electrode has a length in the range from 0.5 $\mu$m to 20 $\mu$m.

3. The device of claim 1, further comprising a semiconductor buffer layer between said first and second semiconductor layers.

4. The device of claim 1 in which said first and second semiconductor materials are selected from the group consisting of Group III-V compound semiconductor materials.

5. The device of claim 4 in which said Group III-V compound semiconductor materials comprise $Al_xGa_{1-x}As$.

6. The device of claim 4 in which said Group III-V compound semiconductor materials comprise $In_xGa_{1-x}As_yP_{1-y}$.

7. The device of claim 6 in which y=1.

* * * * *